（12）United States Patent
Kaneko

(10) Patent No.: US 9,935,426 B2
(45) Date of Patent: Apr. 3, 2018

(54) OPTICAL SEMICONDUCTOR DEVICE

(71) Applicant: Sumitomo Electric Industries, Ltd., Osaka-shi (JP)

(72) Inventor: Toshimitsu Kaneko, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/316,392

(22) Filed: Jun. 26, 2014

(65) Prior Publication Data
US 2015/0010264 A1 Jan. 8, 2015

(30) Foreign Application Priority Data

Jun. 27, 2013 (JP) ................................. 2013-135536

(51) Int. Cl.
| G02F 1/295 | (2006.01) |
| H01S 5/0625 | (2006.01) |
| G02F 1/01 | (2006.01) |
| G02F 1/025 | (2006.01) |
| H01S 5/026 | (2006.01) |
| H01S 5/06 | (2006.01) |
| H01S 5/065 | (2006.01) |
| H01S 5/10 | (2006.01) |

(Continued)

(52) U.S. Cl.
CPC ........ H01S 5/06256 (2013.01); G02F 1/0147 (2013.01); G02F 1/025 (2013.01); G02F 2201/16 (2013.01); G02F 2201/307 (2013.01); G02F 2203/055 (2013.01); H01S 5/0265 (2013.01); H01S 5/0612 (2013.01); H01S 5/0617 (2013.01); H01S 5/0654 (2013.01); H01S 5/06258 (2013.01); H01S 5/1014 (2013.01); H01S 5/1209 (2013.01); H01S 5/34306 (2013.01)

(58) Field of Classification Search
None
See application file for complete search history.

(56) References Cited

U.S. PATENT DOCUMENTS 3,980,392 A * 9/1976 Auracher ................. G02B 6/14
   385/28
6,292,282 B1 * 9/2001 Mossberg ............ G02B 6/2861
   398/87

(Continued)

FOREIGN PATENT DOCUMENTS

| JP | 2007-201425 A | 8/2007 |
| JP | 2010-258297 A | 11/2010 |
| JP | 2011-249618 | 12/2011 |

*Primary Examiner* — Tina Wong
(74) *Attorney, Agent, or Firm* — Venable LLP; Michael A. Sartori; Laura G. Remus

(57) ABSTRACT

An optical semiconductor device is provided as one achieving reduction of power in phase control. The optical semiconductor device has: a first optical waveguide having a plurality of segments each of which has a diffraction grating region with a diffraction grating and a space portion coupled to the diffraction grating region, having two ends interposed between the diffraction grating regions, and having a constant optical length, wherein at least one of the segments is provided with a phase shift structure; a first phase control device for adjusting a phase of light in each segment with the phase shift structure; and a second phase control device for adjusting a phase of light in each segment without the phase shift structure.

12 Claims, 15 Drawing Sheets

(51) Int. Cl.
 *H01S 5/12* (2006.01)
 *H01S 5/343* (2006.01)

(56) References Cited

U.S. PATENT DOCUMENTS

| | | | | |
|---|---|---|---|---|
| 6,594,421 | B1* | 7/2003 | Johnson | G02F 1/011 |
| | | | | 385/1 |
| 6,693,923 | B2* | 2/2004 | Kringlebotn | H01S 3/0675 |
| | | | | 372/102 |
| 7,039,260 | B2* | 5/2006 | Nishiki | G02B 6/12007 |
| | | | | 385/10 |
| 7,057,819 | B1* | 6/2006 | Maheshwari | G02B 26/0808 |
| | | | | 359/290 |
| 7,305,160 | B2* | 12/2007 | Park | G02B 6/12007 |
| | | | | 385/16 |
| 9,207,399 | B2* | 12/2015 | Roth | G02B 6/12026 |
| 2010/0119237 | A1* | 5/2010 | DeCusatis | H04B 10/2519 |
| | | | | 398/147 |
| 2010/0141930 | A1* | 6/2010 | Omichi | G01B 11/18 |
| | | | | 356/33 |
| 2010/0232458 | A1* | 9/2010 | Kim | G02B 6/124 |
| | | | | 372/20 |
| 2011/0243175 | A1* | 10/2011 | Evans | H01S 5/1209 |
| | | | | 372/50.11 |

* cited by examiner

Fig.8
(a)
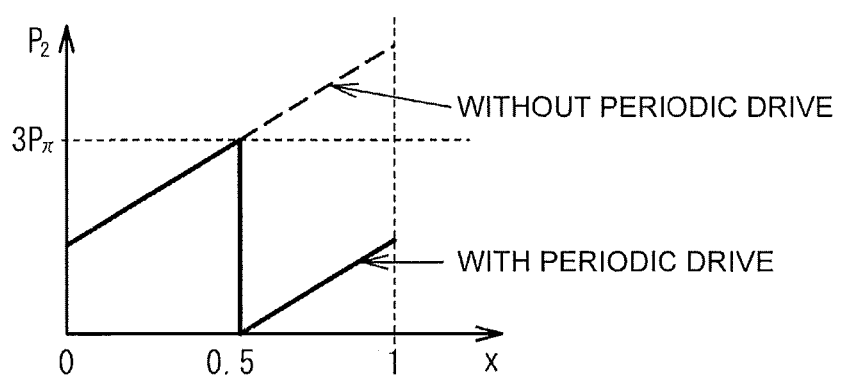
(b)
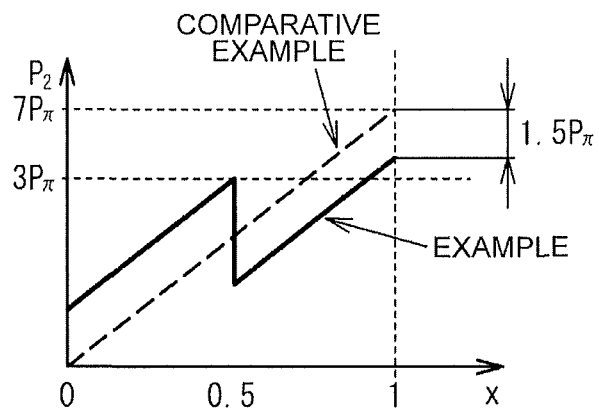

Fig.9
(a)
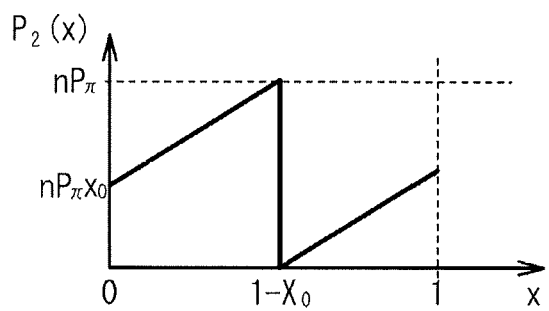
(b)
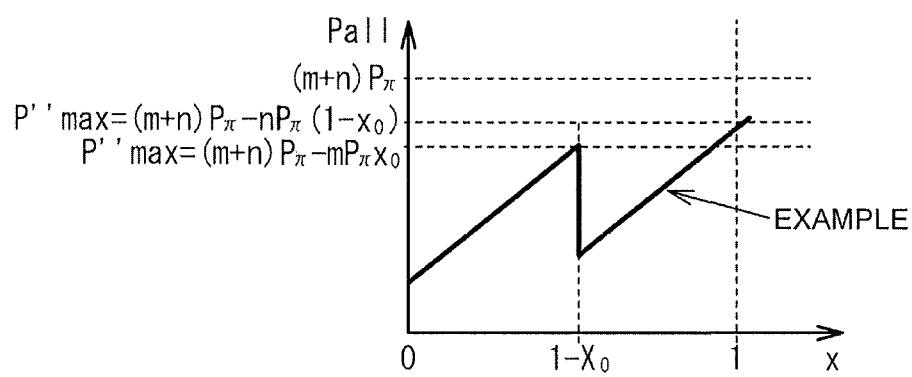

*Fig.12*

| | INITIAL SET VALUES | | | | | | | |
|---|---|---|---|---|---|---|---|---|
| Ch | $I_{LD}$ [mA] | $I_{SOA}$ [mA] | $Pa_{Heater}$ [mW] | $Pb_{Heater}$ [mW] | $Pc_{Heater}$ [mW] | $Pd_{Heater}$ [mW] | $Pe_{Heater}$ [mW] | $T_{LD}$ [deg. C] |
| 1 | 180 | 180 | 0 | 0 | 0 | 0 | 0 | 50 |
| 2 | 180 | 180 | 16 | 16 | 16 | 32 | 2880 | 50 |
| 3 | 180 | 180 | 32 | 32 | 32 | 64 | 5760 | 50 |
| ⋮ | ⋮ | ⋮ | ⋮ | ⋮ | ⋮ | ⋮ | ⋮ | ⋮ |
| n | 180 | 180 | 24 | 24 | 24 | 32 | 2880 | 50 |

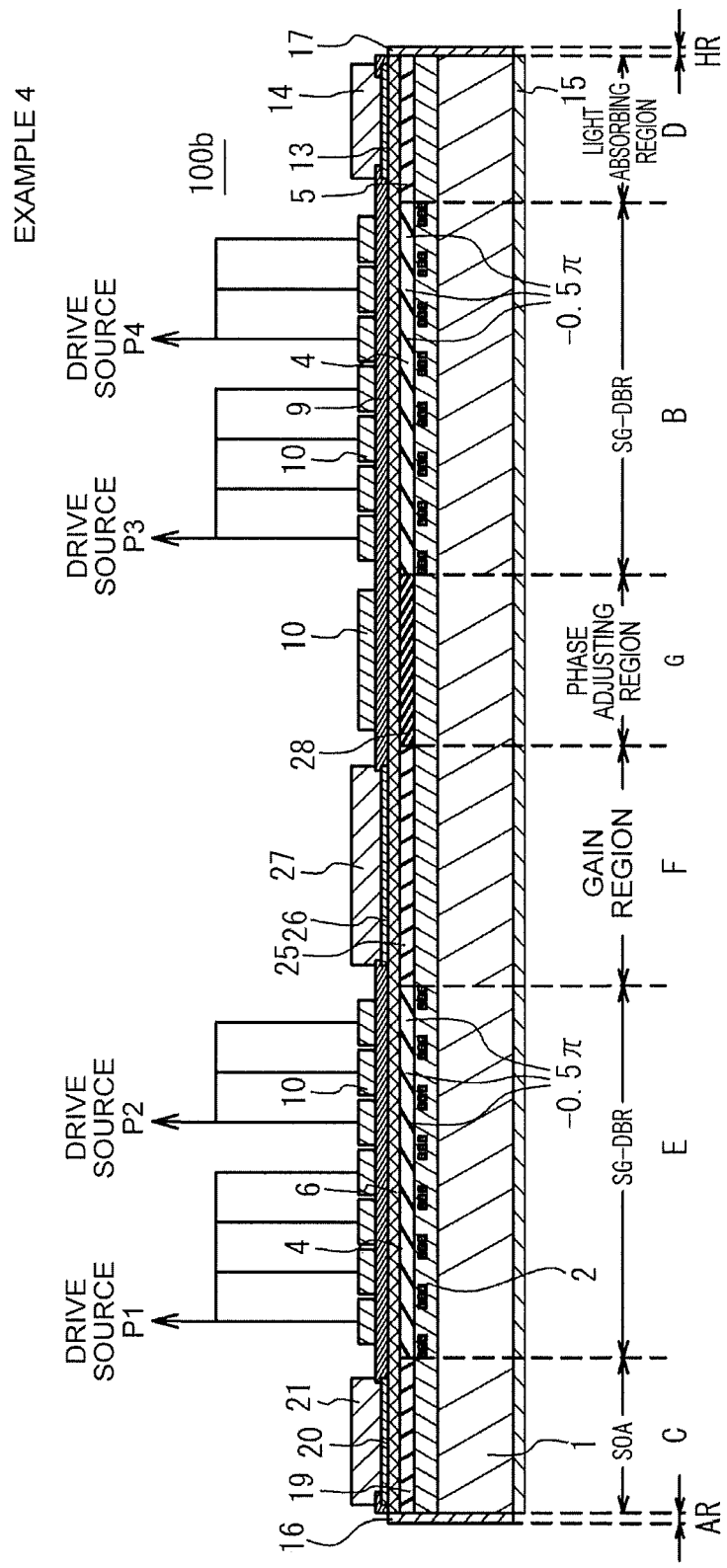

US 9,935,426 B2

OPTICAL SEMICONDUCTOR DEVICE

TECHNICAL FIELD

The present invention relates to an optical semiconductor device.

BACKGROUND

A known sampled grating (SG: Sampled Grating) has a configuration wherein a plurality of segments each composed of a diffraction grating portion with a diffraction grating and a space portion are coupled. There is the known technology of attaching a phase adjusting mechanism to the sampled grating and controlling it, thereby implementing selection of an arbitrary wavelength (e.g., cf. Patent Literature 1).

Patent Literature 1: Japanese Patent Application Laid-Open No. 2011-249618

SUMMARY

However, the technology of Patent Literature 1 has the problem that there is a risk of increase of power in phase control.

The present invention has been accomplished in view of the above problem and it is one of objects of the present invention to provide an optical semiconductor device achieving reduction of power in phase control.

An optical semiconductor device according to one aspect of the present invention comprises: a first optical waveguide comprising a plurality of segments each of which has a diffraction grating region with a diffraction grating and a space portion coupled to the diffraction grating region, having two ends interposed between the diffraction grating regions, and having a constant optical length, wherein at least one of the segments is provided with a phase shift structure; first phase control means for adjusting a phase of light in each segment with the phase shift structure; and second phase control means for adjusting a phase of light in each segment without the phase shift structure. The optical semiconductor device according to one aspect of the present invention achieves reduction of power in phase control.

The optical semiconductor device may be configured as follows: the number of the plurality of segments is N; the number of segments without the phase shift structure is m; the number of segments with the phase shift structure is n (=N−m); a phase shift amount of −n/(m+n)π is set in each segment with the phase shift structure, with respect to the segments without the phase shift structure. A part of the segments in the first optical waveguide may be a region to generate an optical gain. The optical semiconductor device may be configured as follows: it comprises A different phase control means; each of phase shift amounts of the segments corresponding to the different phase control means is −π/A× (i−1), i=1~A.

The optical semiconductor device may be configured as follows: it further comprises a second optical waveguide comprising a plurality of segments each of which has a diffraction grating region with a diffraction grating and a space portion coupled to the diffraction grating region, having two ends interposed between the diffraction grating regions, and having a constant optical length; the second optical wavelength is optically coupled to the first optical waveguide. A further phase shift amount of −0.5π may be added to the segment closest to the second optical waveguide, out of the segments in the first optical waveguide. The phase control means may be heaters for heating the segments. The optical semiconductor device may be arranged on a temperature control device for controlling a temperature of the optical semiconductor device.

One aspect of the present invention successfully provides the optical semiconductor device achieving the reduction of power in the phase control.

BRIEF DESCRIPTION OF THE DRAWINGS

FIGS. 8 (a) and (b) are drawings showing relations between control phase and power value.

FIGS. 9 (a) and (b) are drawings showing relations between phase control amount and power value.

FIG. 12 is an example of a lookup table.

FIG. 15 is a schematic cross-sectional view of a semiconductor laser according to Example 4.

DETAILED DESCRIPTION

Figure 1:
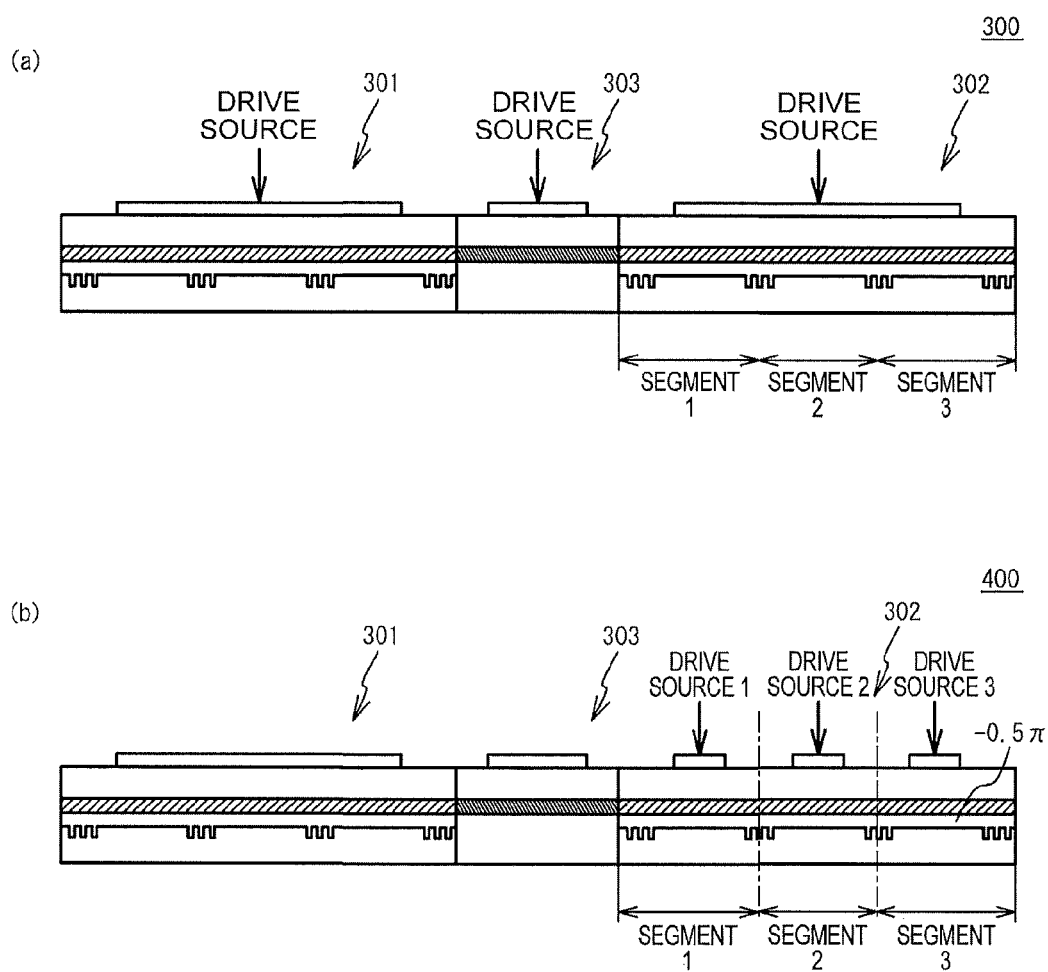
FIG. 1 (a) is a schematic cross-sectional view of a semiconductor laser according to a comparative example, and (b) a schematic cross-sectional view of a semiconductor laser in an embodiment of the present invention.

First, the principle in one embodiment of the present invention will be described. FIG. 1 (a) is a schematic cross-sectional view of a semiconductor laser 300 according to a comparative example. The semiconductor laser 300 has a structure in which a gain region 303 is interposed between an SG-DBR (Sampled Grating Distributed Bragg Reflector) region 301 and an SG-DBR region 302. Each of the SG-DBR region 301 and the SG-DBR region 302 has a sampled grating composed of a plurality of serially-coupled segments each of which consists of a diffraction grating portion with a diffraction grating and a space portion.

In the semiconductor laser 300, the refractive index is controlled by a common power source to the plurality of segments provided, in each of the SG-DBR region 301 and the SG-DBR region 302. In each of the SG-DBR region 301 and SG-DBR region 302, a discrete reflection spectrum with peak intensities at predetermined wavelength intervals is generated. By a combination of two reflection spectra, the laser can stably lase at a desired wavelength by taking advantage of the vernier effect.

In contrast to it, FIG. 1 (b) is a schematic cross-sectional view of a semiconductor laser 400 in an embodiment of the present invention. In the semiconductor laser 400, the segment 3 is provided with a phase shift structure (e.g., a phase shift amount of −0.5π) in the SG-DBR region 302. Furthermore, at least the segments 1, 2 and the segment 3 receive respective control currents supplied from separate drive sources. The refractive index control is implemented, for example, by control of temperature of the segments, injection of electric current into the segments, or the like, with no particular restrictions thereon. As an example, the below will describe the control of temperature of the segments with heaters.

Figure 2:
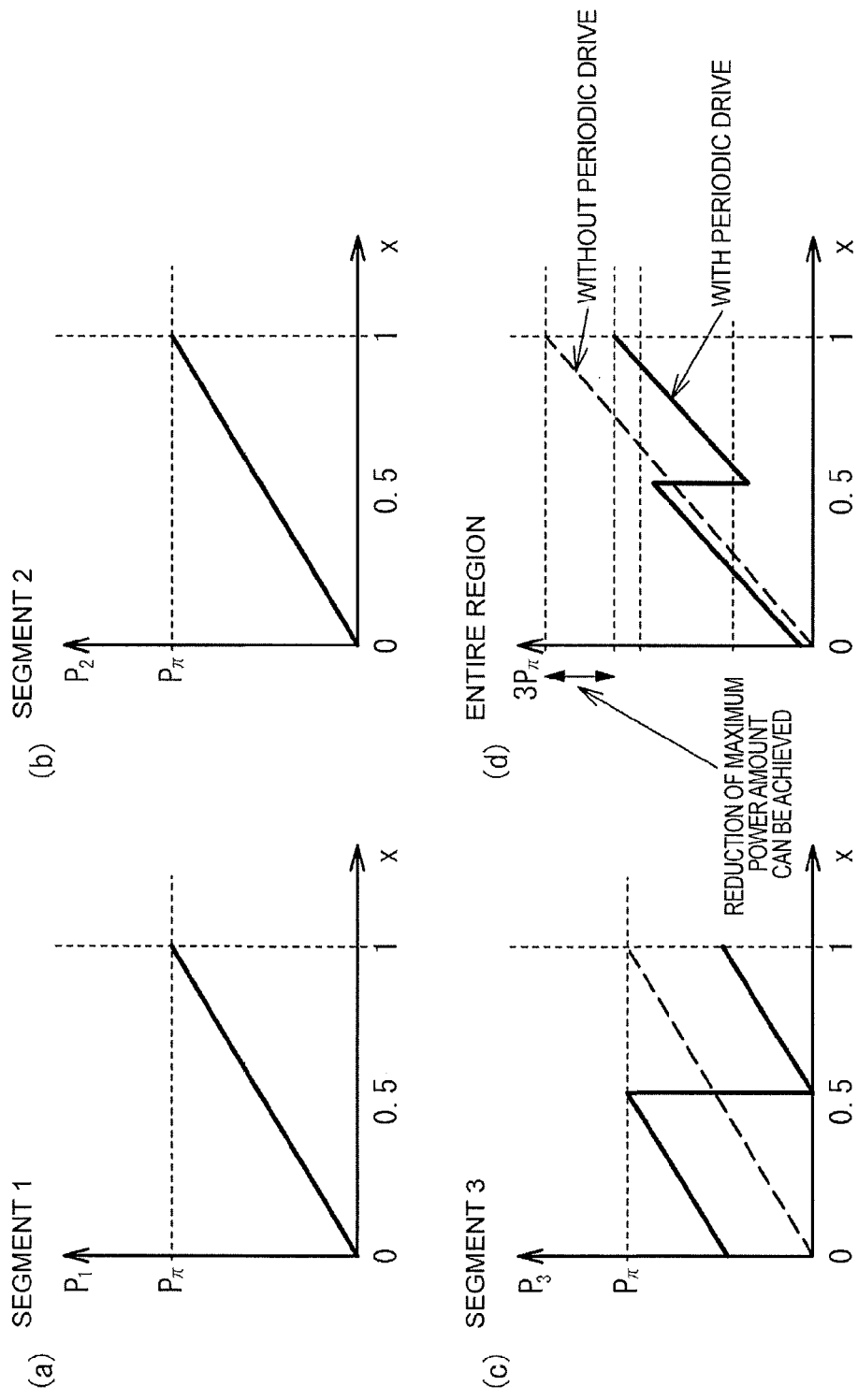
FIG. 2 (a) to (d) are drawings showing relations between control phase and power value.

FIG. 2 (a) to (c) show phase changes with injection of the control currents on the X-axis and power values with injection of the control currents on the Y-axis, in the segments 1 to 3, respectively, in the semiconductor laser 400. x=0~1 corresponds to phase shift amount=0~π. As shown in FIGS. 2 (a) and (b), the segments 1 and 2 demonstrate a proportional relation of power values to phase changes. On the other hand, as shown in FIG. 2 (c), the segment 3 is formed with the phase change of −0.5π and, therefore, one cycle ends at the phase change of 0.5π; for this reason, the same phase difference can be achieved even with a power setting lowered by a power corresponding to one cycle at this point. Therefore, a maximum power amount with the phase changes in all the regions of the segments 1 to 3 can be lowered as indicated by a solid line in FIG. 2 (d).

Figure 3:
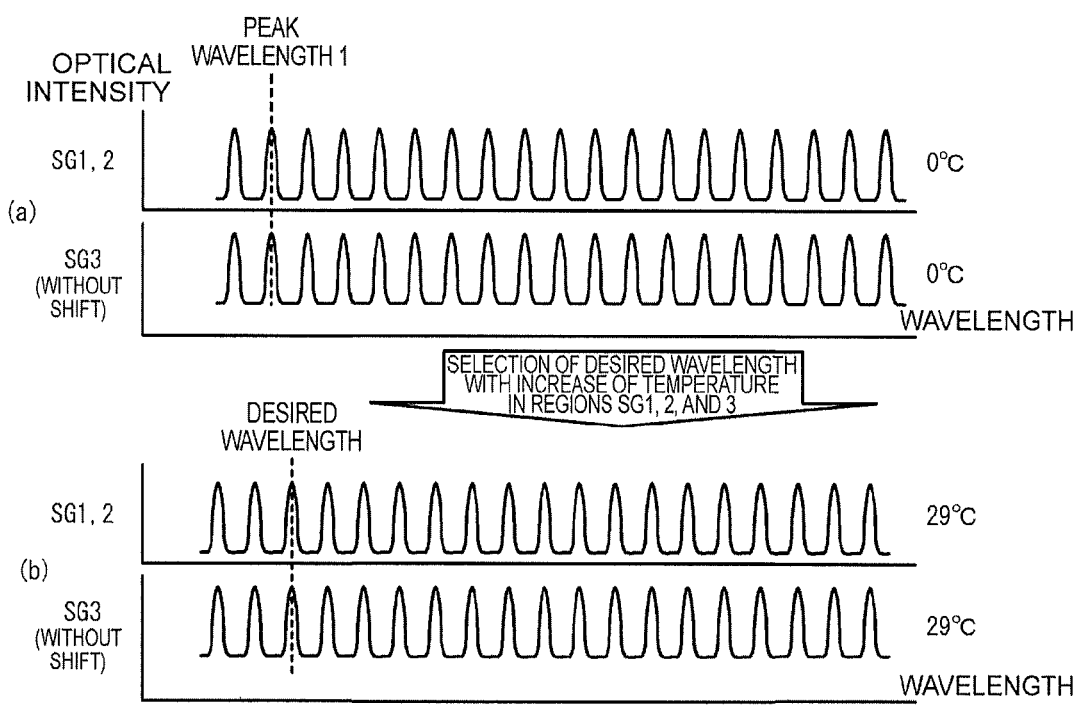
FIGS. 3 (a) and (b) are drawings showing an example in which phases change by one cycle change with a temperature change of 30° C.

FIGS. 3 (a) and (b) are drawings showing an example in which the phase change is one cycle change with a temperature change of 30° C., in the semiconductor laser 300 of the comparative example. In FIGS. 3 (a) and (b), the upper reflection spectrum represents the reflection spectra from the segment 1 (SG1) and the segment 2 (SG2) and the lower reflection spectrum the reflection spectrum from the segment 3 (SG3). In order to cover the desired wavelength range, as shown in FIGS. 3 (a) and (b), a minimum required power is the temperature change of 0° C. for all of 3 segments and a maximum required power is what to give a 30° C.-temperature increase for all of 3 segments.

Figure 4:
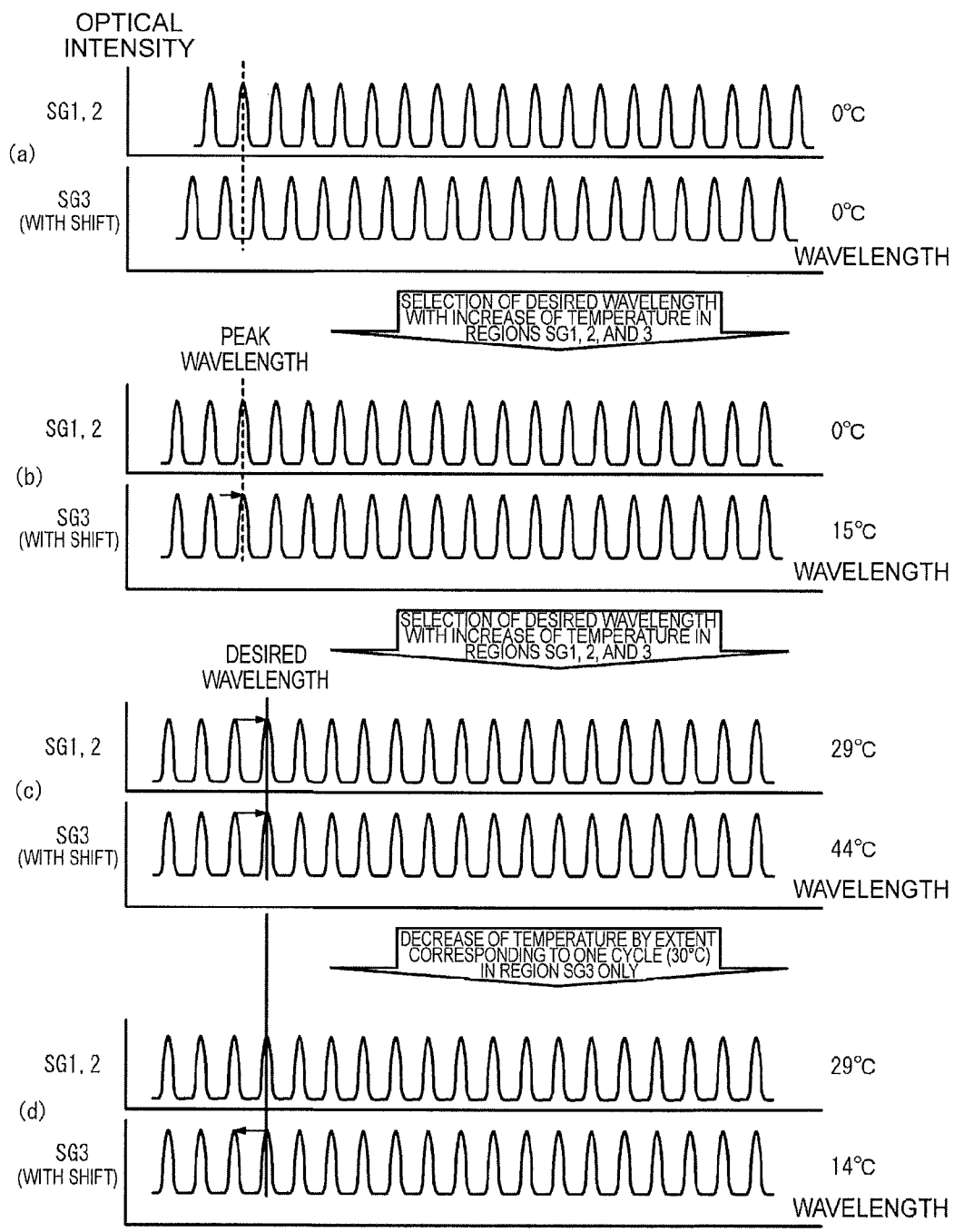
FIG. 4 (a) to (d) are drawings showing an example in which phases change by one cycle change with a temperature change of 30° C.

FIG. 4 (a) to (d) are drawings showing an example in which the phase change is one cycle change with the temperature change of 30° C., in the semiconductor laser 400. In FIG. 4 (a) to (d), the upper reflection spectrum represents the reflection spectra from the segment 1 (SG1) and the segment 2 (SG2) and the lower reflection spectrum the reflection spectrum from the segment 3 (SG3). Since the segment 3 is provided with the phase shift structure of −0.5π, there is the phase shift of 0.5π between the period of the reflection spectra from the segments 1, 2 and the period of the reflection spectrum from the segment 3, as shown in FIG. 4 (a). By raising the temperature of the segment 3, as shown in FIG. 4 (b), the peak wavelengths of the segments 1 to 3 can be matched with each other. As shown in FIG. 4 (c), a desired wavelength can be selected by changing the temperatures of the segments 1 to 3 from the state of FIG. 4 (b). Next, as shown in FIG. 4 (d), the temperature of the segment 3 is lowered by an extent equivalent to one phase cycle (30° C.) from the state of FIG. 4 (c).

Since the period of the wavelength peaks of the segment 3 is shifted from that of the other segments, the maximum power can be reduced by this temperature control. This is because the shift of the maximum temperature point leads to reduction in total maximum power. For example, the minimum power is the power necessary for the temperature change of 0° C. for two segments—+15° C. for a segment. And the maximum power is the power necessary for the temperature change of 30° C. for two segments +15° C. for a segment. Therefore, the semiconductor laser 400 can achieve the reduction of power in the phase control in comparison with the semiconductor laser 300. Specific examples will be described below.

Example 1

Figure 5:
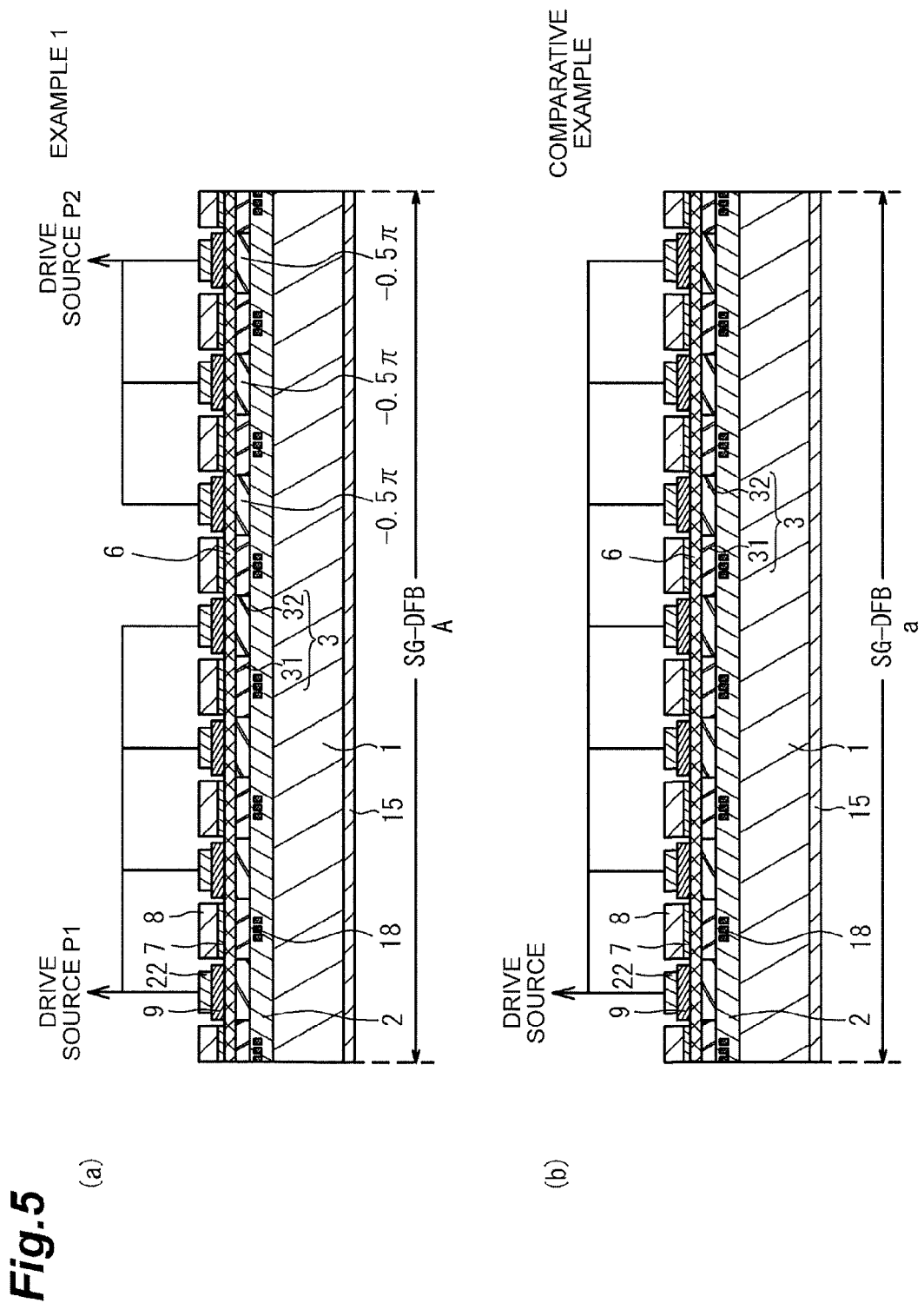
FIG. 5 (a) is a schematic cross-sectional view of an SG-DFB region according to Example 1, and (b) a schematic cross-sectional view of an SG-DFB region according to a comparative example.

FIG. 5 (a) is a schematic cross-sectional view of an SG-DFB (Sampled Grating Distributed Feedback) region A according to Example 1. The SG-DFB region A has a gain and is provided with a sampled grating. For example, it is optically coupled to an SG-DBR (Sampled Grating Distributed Bragg Reflector) region or the like to constitute a laser resonator.

The SG-DFB region A has a structure in which a lower cladding layer 2, an optical waveguide layer 3, and an upper cladding layer 6 are layered on a substrate 1. Provided on the upper cladding layer 6 are regions in each of which a contact layer 7 and an electrode 8 are layered, and regions in each of which a heater 22 is laid on an insulating film 9. Each heater 22 is provided with a power electrode and a ground electrode not shown.

The substrate 1 is, for example, a crystalline substrate comprised of n-type InP. The lower cladding layer 2 is n-type and the upper cladding layer 6 p-type, each of which is comprised, for example, of InP. The lower cladding layer 2 and the upper cladding layer 6 function to achieve optical confinement of the optical waveguide layer 3 above and below it. The optical waveguide layer 3 has a structure in which active waveguides 31 with a gain along a light propagation direction and passive waveguides 32 with no gain are alternately arranged. Each active waveguide 31 has, for example, a quantum well structure, e.g., a structure in which well layers of $Ga_{0.32}In_{0.68}As_{0.92}P_{0.08}$ (5 nm thick) and barrier layers of $Ga_{0.22}In_{0.78}As_{0.47}P_{0.53}$ (10 nm thick) are alternately layered. The contact layer 7 and electrode 8 are arranged above each active waveguide 31. Each passive waveguide 32 is, for example, an InGaAsP-based bulk layer with the PL wavelength difference of not less than 200 nm, an AlGaInP-based quantum well structure layer with the PL wavelength difference of not less than 1.5 μm, or the like. Each heater 22 is a thin-film resistor comprised of NiCr or the like and is arranged above the corresponding passive waveguide 32.

The contact layers 7 can be comprised, for example, of p-type $Ga_{0.47}In_{0.53}As$ crystal. The insulating films 9 are protective films comprised of an insulator such as SiN or $SiO_2$. The electrodes 8 are comprised of an electroconductive material such as gold. A back electrode 15 is formed on the bottom of the substrate 1.

Diffraction gratings (corrugations) 18 are formed at a plurality of portions with predetermined intervals in the lower cladding layer 2. They form the sampled grating in the SG-DFB region A. In the SG-DFB region A, a plurality of segments are provided in the lower cladding layer 2. The segments herein refer to a region where sets of a diffraction grating portion with the diffraction grating 18 and a space portion without the diffraction grating 18 are continuously provided. Namely, the segments refer to a region where the space portions having their ends interposed between the diffraction grating portions, and the diffraction grating portions are serially coupled. The diffraction gratings 18 are comprised of a material with the refractive index different from that of the lower cladding layer 2. When the lower cladding layer 2 is InP, the material of the diffraction gratings can be, for example, $Ga_{0.22}In_{0.78}As_{0.47}P_{0.53}$.

The diffraction gratings 18 can be formed by patterning using the two-beam interference exposure method. The space portions located between the diffraction gratings 18 can be substantialized by first performing exposure of patterns of the diffraction gratings in a resist and thereafter again performing exposure at positions corresponding to the space portions. The SG-DFB region A has a structure in which the plurality of segments having substantially the same optical length are serially coupled. The optical length of the segments in the SG-DFB region A is, for example, about 160 µm.

At least one of the plurality of segments forming the SG-DFB region A is provided with the phase shift structure. In the present example, the three segments on one end side are provided with the phase shift structure of the phase shift amount of $-0.5\pi$, whereas the four segments on the other end side are not provided with the phase shift structure. The heaters 22 of the segments without the phase shift structure (segments SG1 hereinafter) are connected to a first drive source P1. The heaters 22 of the segments with the phase shift structure (segments SG2 hereinafter) are connected to a second drive source P2 different from the first drive source P1. This configuration allows the segments SG1 and the segments SG2 to be subjected to respective phase controls independent of each other.

Figure 6:
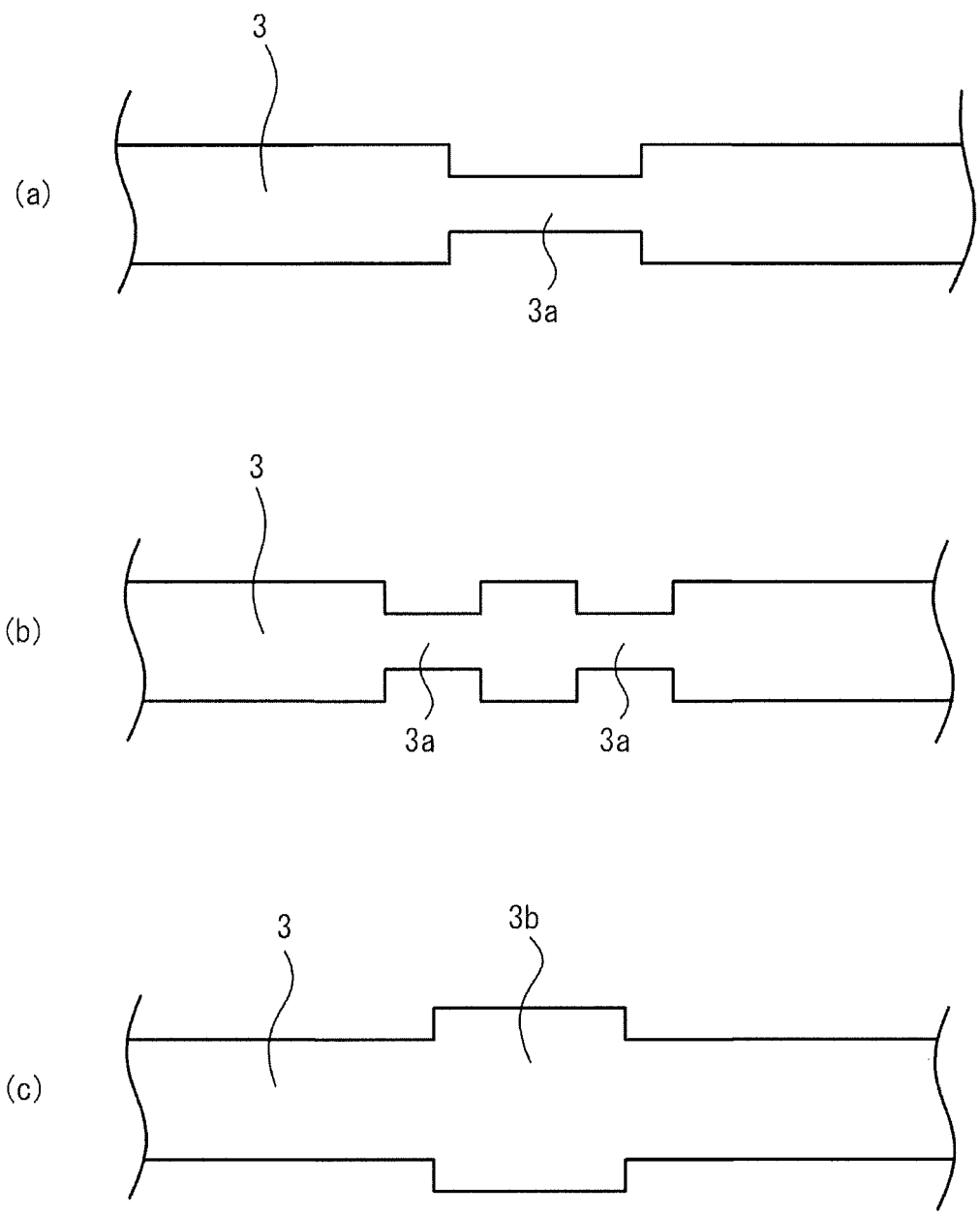
FIG. 6 (a) to (c) are drawings showing phase shift structures.

For example, the phase shift structure can be substantialized by providing a region where the width of the waveguide is partly decreased (or increased), in the space portion of the segment SG2. FIG. 6 (a) is a top plan view of the segment SG2. As shown in FIG. 6 (a), the space portion of the segment SG2 may be provided with a width-decreased part 3a. As shown in FIG. 6 (b), a plurality of width-decreased parts 3a may be separately provided in the space portion. As shown in FIG. 6 (c), a width-increased part 3b may be provided instead of the width-decreased part 3a. With any of these, there appear portions where the propagation constant varies at boundaries to other waveguides (or at two locations, front and back). This variation of propagation constant realizes the aforementioned phase shift. A variation amount of the propagation constant can be determined by a change amount of the waveguide width. When the phase shift is introduced by this method, all the phases of structural pitches of the diffraction gratings in the SG-DFB region A are identical.

There are a variety of other methods for introducing the phase shift. For example, it is also possible to adopt a method of directly shifting the position of a partial diffraction grating. Another phase shift structure can also be implemented by a method of introducing a material with the refractive index different from that of the other region into a part of the optical waveguide.

The below will describe the effect achieved by the independent controls of the heaters 22 in the segments SG1 and the heaters 22 in the segments SG2. Prior to the description of the effect, a comparative example will be described. FIG. 5 (b) is a schematic cross-sectional view of an SG-DFB region a according to the comparative example. The SG-DFB region a is different from the SG-DFB region A, in that the segments in the SG-DFB region a are not provided with the the phase shift structure and a common drive source is connected to the heaters 22 of the respective segments in the SG-DFB region a.

Figure 7:
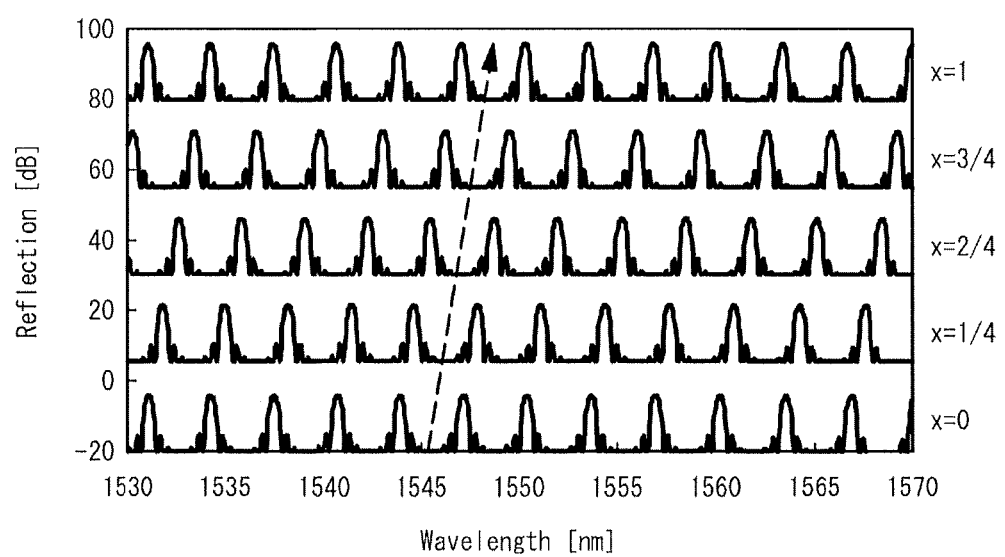
FIG. 7 is longitudinal-mode reflection spectra depending upon phase control amounts x.

FIG. 7 is longitudinal-mode reflection spectra depending upon phase control amounts x, in the SG-DFB region a according to the comparative example. The phase control amounts x are related to refractive index change amounts $\Delta n_{pc}$ by Formula (1) below. Lpc represents the length of the phase-adjusted region. In the SG-DFB region A and SG-DFB region a, the length of the phase-adjusted region is the length of the passive region 32 in the light propagation direction. Since this Lpc is sufficiently longer (e.g., 100 µm) than the generally-required wavelength variable range (e.g., 1.528-1.568 µm), we can ignore wavelength dependence of phase change amount due to refractive index change.

[Formula 1]

$$x = 2\frac{Lpc}{\lambda}\Delta n_{pc} \quad (1)$$

As shown in FIG. 7, the longitudinal-mode spectra of the SG-DFB region a are comb-shaped spectra and a wavelength tunable laser integrated with the SG-DBR employing it uses any one peak selected from the spectra by the SG-DBR. Therefore, an arbitrary wavelength can be obtained by execution of the phase control from x=0 to 1 in the SG-DFB region a as shown in this figure.

When the phase control is implemented by use of heaters, the phase change amount is proportional to input power P. Unless the phase-adjusted region length Lpc is extremely shorter than the thermal diffusion length, the input power P is not dependent upon the phase-adjusted region length Lpc, either. However, the same optical path length is needed for the segments and, therefore, the power needs to be one proportional to the number of segments. Supposing $P_\pi$ represents a power per segment necessary for the phase control of x=1, a maximum value of power necessary for obtaining an arbitrary wavelength can be expressed by Formula (2) below, using the total segment number A.

[Formula 2]

$$P_{max}=A \cdot P_\pi \quad (2)$$

For example, when the segment number A is 7 and $P_\pi$ 40 mW, Pmax is 280 mW. Therefore, the very large power is needed.

In contrast to it, the SG-DFB region A according to the present example is provided, for example, with the seven segments, three (segments SG2) of which are provided with the phase shift structure of $-0.5\pi$ when compared with the other four segments SG1. In the present example, the segments SG1 are controlled independently of the segments SG2.

In the case of this structure, for obtaining the comb-shaped spectra as shown in FIG. 7, even if the phase control amount x of the segments SG1 is 0, it is necessary to supply the phase control power of $P_2(x=0)=3\times 0.5P_\pi$ to the segments SG2. As for the consumed power in this case, as shown in FIG. 8 (a), it is necessary to supply the power ranging from $3\times 0.5P_\pi$ to $3\times 1.5P_\pi$ to the segments SG2, in the case of the phase control of x=0~1 in the segments SG1, and thus a necessary maximum power Pmax can be expressed by Formula (3) below.

[Formula 3]

$$P_{max}=4\times P_\pi+3\times 1.5P_\pi=8.5P_\pi \quad (3)$$

Accordingly, the power is $1.5P_\pi$ larger than that ($7P_\pi$) in the case without the phase shift.

However, since the number of modes in one segment ($2\times n_r\times Lseg/\lambda$, $n_r$: average refractive index and Lseg: segment length) is large, approximately 400 or more, a power resulting from subtraction of $\pi$ can be supplied to the drive region where the phase control amount exceeds 1 in the segments SG2, while taking account of the fact that there arises no significant problem of reflection characteristics even with a difference of one in the number of modes (or taking account of the fact that in FIG. 7 the spectrum with the phase adjustment=0 is almost the same as that with the phase adjustment=π). With execution of this drive, the control power $P_2(x)$ of the segments SG2 against the phase shift amount x of the segments SG1 follows the power curve as shown in FIG. 8 (b). Since the power for the segments SG1 is 3×$P_\pi$, the maximum power necessary for generation of an arbitrary wavelength becomes 5.5$P_\pi$. Therefore, the power can be reduced by 1.5$P_\pi$.

Now, let us study an optimum value of phase shift amount. Let us assume that the SG-DFB region A is provided with N segments, the number of segments SG1 without the phase shift structure is m, and the number of segments SG2 with the phase shift structure is n (=N−m). The segments SG2 are assumed to be provided with the phase shift structure of a phase shift amount of $\varphi_0$ (=−π$x_0$). The total control power $P_2(x)$ for all the segments SG2 is shown in FIG. 9 (a). The total control power $P_{all}$ for all the segments SG1 and all the segments SG2 is shown in FIG. 9 (b).

The power $P_1(x)$ necessary for giving the phase shift amount x (0≤x≤1) to the passive waveguides 32 of the segments SG1 is expressed by Formula (4) below, using the power $P_\pi$ per segment.

[Formula 4]

$$P_1(x)=m \times P_\pi \times x \quad (4)$$

On the other hand, since the segments SG2 are provided with the phase shift structure of the shift amount of −π$x_0$, the power $P_2(x)$ necessary for giving the phase shift amount (0≤x≤1) to the passive waveguides 32 of the segments SG2 in order to provide them with the phase in the same optical path length as that of the segments SG1 is expressed by Formula (5) below.

[Formula 5]

$$P_2(x)=n \times P_\pi \times (x+x_0) \quad (5)$$

Since the power $P_2(x)$ needs only to enable the drive from 0 to $nP_\pi$, it is sufficient to supply the power resulting from subtraction of $nP_\pi$ from Formula (5) after a point where the power $P_2(x)$ exceeds $nP_\pi$ as shown in FIG. 9 (a). The point x where the power $P_2(x)$ exceeds $nP_\pi$ is 1−$x_0$. Therefore, the total of consumed power is expressed by Formula (6) below, in the drive range of 0≤x≤(1−$\varphi_0$).

[Formula 6]

$$P_1(x)+P_2(x)=\{m \times P\pi \times x\}+\{n \times P\pi \times (x+x_0)\}=x(m+n)P\pi+nP\pi x_0 \quad (6)$$

A maximum point of consumed power P'max in this range is the power in the case of x=1−$\varphi_0$, i.e., P'max=(m+n)$P_\pi$−$mP_\pi x_0$. On the other hand, in the drive range of (1−$\varphi_0$)<x≤1, the control power for the segments SG2 is given as $P_2(x)$=n×$P_\pi$×(x+$x_0$−1); therefore, the total consumed power is given by Formula (7) below and a maximum point of consumed power P''max in this range is the power in the case of x=1 as expressed by Formula (8) below.

[Formula 7]

$$P_1(x)+P_2(x)= \\ \{m \times P_\pi \times x\}+\{nP_\pi \times (x+x_0-1)\}=x(m+n)P_\pi-nP_\pi(1-x_0) \quad (7)$$

[Formula 8]

$$P''_{max}=(m+n)P_\pi-nP_\pi(1-x_0) \quad (8)$$

Since an optimum value of the built-in phase to minimize the control power is the higher between P'max and P''max, the drive power becomes minimum in the case of P'max=P''max, i.e., in the case where Formula (9) below holds.

[Formula 9]

$$(m+n)P_\pi-mP_\pi x_0=(m+n)P_\pi-nP_\pi(1-x_0) \quad (9)$$

Therefore, when the N segments are divided into two groups in the ratio of m:n, the minimum control power can be achieved by giving the built-in phase of Formula (10) below to the segments SG2 (n segments). The maximum control power Pmax at this time is given by Formula (11) below and then it becomes feasible to reduce the consumed power by mn/(m+n)·$P_\pi$.

[Formula 10]

$$\phi_0 = -\pi x_0 = -\frac{n}{m+n}P_\pi \quad (10)$$

[Formula 11]

$$P_{max} = (m+n)P_\pi - \frac{mn}{m+n}P_\pi \quad (11)$$

Therefore, the optimum value of the phase shift amount is expressed by Formula (12) below.

[Formula 12]

$$\phi_0 = -\pi x_0 = -\frac{3}{4+3}\pi \cong -0.43\pi \quad (12)$$

For example, in the case of $P_\pi$=40 mW, the maximum drive consumed power in the case without the phase shift structure is 560 mW, whereas with formation of the phase shift of −3/(3+4), it becomes feasible to achieve reduction in consumed power of about 68 mW in each of front/rear mirrors; therefore, the necessary power can be 424 mW, with reduction in consumed power of about 24%.

Supposing the number m of segments SG1 and the number n of segments SG2 are m=(1−k)N and n=kN, the maximum reduction amount −mn/(m+n)×$P_\pi$ is obtained as the relation of Formula (13) below.

[Formula 13]

$$-\frac{mn}{m+n}P_\pi = -\frac{N^2}{N}(1-k)k \times P_\pi = NP_\pi\left\{(k-0.5)^2 - \frac{1}{4}\right\} \quad (13)$$

The consumed power becomes minimum with k=0.5, i.e., in the case where the segments are equally divided into two groups. The reduction at this time is −N$P_\pi$/4, i.e., 25%.

According to the present example, at least one of the plurality of segments is provided with the phase shift structure and the heaters corresponding to the segments with the phase shift structure and the heaters corresponding to the segments without the phase shift structure are controlled by the separate drive sources, thereby achieving the reduction in consumed power in the phase control. It is noted herein that the optical waveguide in the SG-DFB region region A functions as the first optical waveguide, the heaters 22 corresponding to the segments SG2 function as the first phase control means, and the heaters 22 corresponding to the segments SG1 function as the second phase control means. For allowing the first phase control means and the second phase control means to be controlled independently of each other, the heaters 22 corresponding to the segments SG2 are provided each with a terminal electrically isolated from the heaters 22 corresponding to the segments SG1. When the heaters are employed as the phase control means, it is also possible to adopt a configuration wherein the ground-side terminals of the respective heaters 22 are connected in common and the terminals opposite to the ground-side terminals are composed of the electrically-isolated terminals.

Example 2

Figure 10:
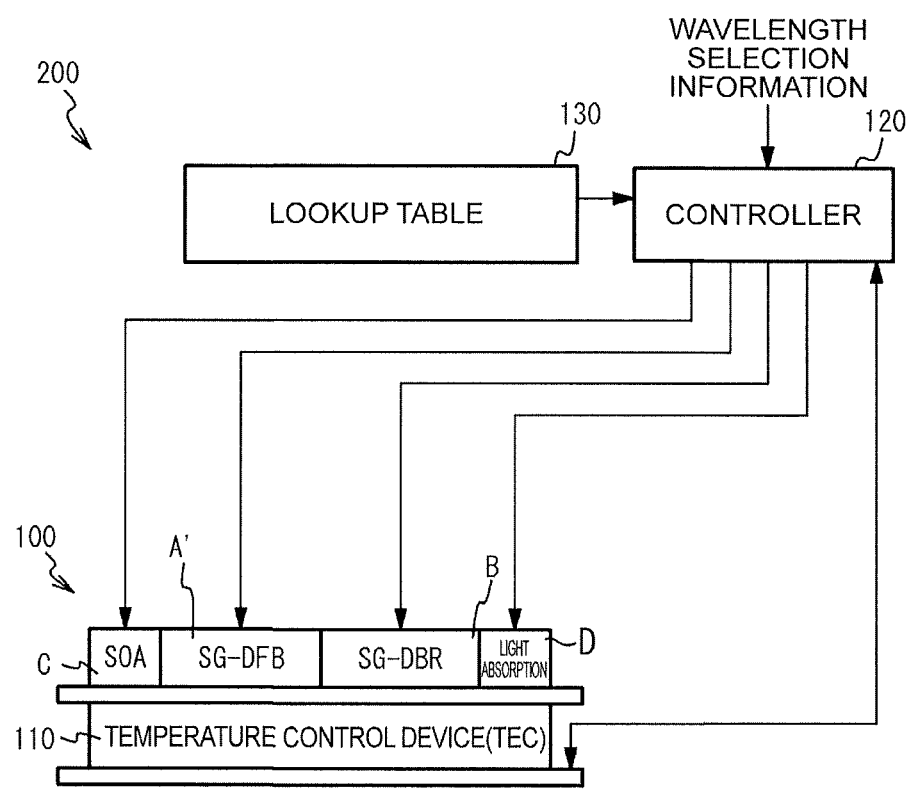
FIG. 10 is a drawing showing an overall configuration of a wavelength tunable semiconductor laser according to Example 2 and a laser device provided with it.

FIG. 10 is a drawing showing an overall configuration of a wavelength tunable semiconductor laser 100 according to Example 2 and a laser device 200 provided with the semiconductor laser 100. As shown in FIG. 10, the laser device 200 is provided with the semiconductor laser 100, a temperature control device 110, and a controller 120. The semiconductor laser 100 is arranged on the temperature control device 110. The temperature control device 110 includes a Peltier device or the like to control the temperature of the semiconductor laser 100. The controller 120 is configured with a control section including a CPU (central processing unit), a RAM (random access memory), a ROM (read only memory), and so on and functions as a drive circuit. The ROM of the controller 120 stores control information of the semiconductor laser 100, a control program thereof, and so on. The control information is stored, for example, in a lookup table 130.

Figure 11:
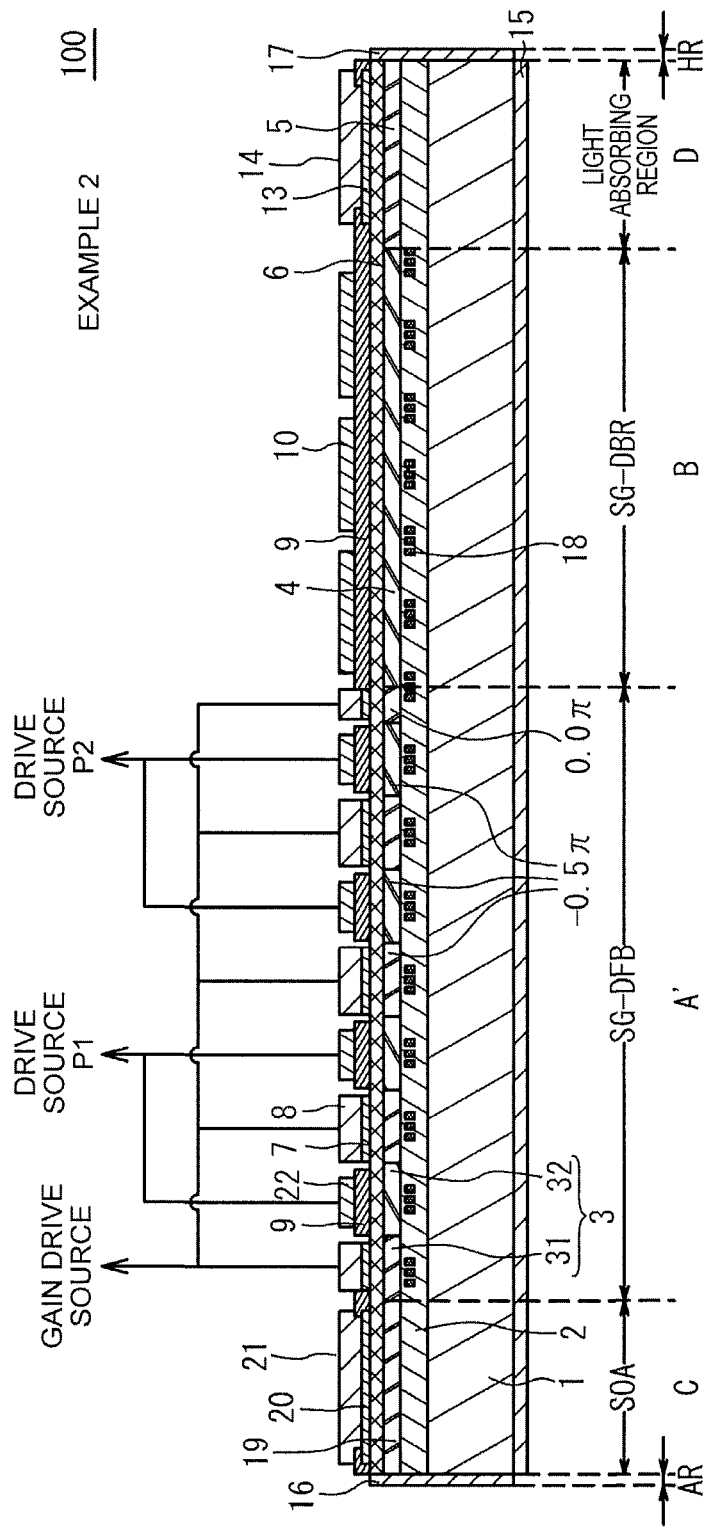
FIG. 11 is a schematic cross-sectional view showing an overall configuration of a semiconductor laser.

FIG. 11 is a schematic cross-sectional view showing the overall configuration of the semiconductor laser 100. As shown in FIG. 11, the semiconductor laser 100 is provided with an SG-DFB (Sampled Grating Distributed Feedback) region A', an SG-DBR (Sampled Grating Distributed Bragg Reflector) region B, an SOA (Semiconductor Optical Amplifier) region C, a light absorbing region D, an antireflection film AR, and a reflecting film HR.

As an example, the semiconductor laser 100 is configured so that the antireflection film AR, SOA region C, SG-DFB region A', SG-DBR region B, light absorbing region D, and reflecting film HR are arranged in this order from the front side to the rear side. The SG-DFB region A' has a gain and is provided with the sampled grating. The SG-DBR region B has no gain and is provided with the sampled grating. The SOA region C functions as an optical amplifier.

The SG-DBR region B has a structure in which the lower cladding layer 2, optical waveguide layer 4, upper cladding layer 6, insulating film 9, and heaters 10 are layered on the substrate 1. Each heater 10 is provided with a power electrode and a ground electrode not shown. The SOA region C has a structure in which the lower cladding layer 2, an optical amplification layer 19, the upper cladding layer 6, a contact layer 20, and an electrode 21 are layered on the substrate 1. The light absorbing region D has a structure in which the lower cladding layer 2, a light absorbing layer 5, the upper cladding layer 6, a contact layer 13, and an electrode 14 are layered on the substrate 1. An end face film 16 consists of an AR (Anti Reflection) film. The reflecting film 17 consists of an HR (High Reflection) film.

In the SG-DFB region A', SG-DBR region B, SOA region C, and light absorbing region D, the substrate 1, lower cladding layer 2, and upper cladding layer 6 are integrally formed. The optical waveguide layer 3, optical waveguide layer 4, light absorbing layer 5, and optical amplification layer 19 are formed on an identical surface. A boundary between the SG-DFB region A' and the SG-DBR region B corresponds to a boundary between the optical waveguide layer 3 and the optical waveguide layer 4.

The end face film 16 is formed on the end faces of the substrate 1, lower cladding layer 2, optical amplification layer 19, and upper cladding layer 6 on the SOA region C side. In the present example, the end face film 16 is an AR (Anti Reflection) film. The end face film 16 functions as a front-side end face of the semiconductor laser 100. The reflecting film 17 is formed on the end faces of the substrate 1, lower cladding layer 2, light absorbing layer 5, and upper cladding layer 6 on the light absorbing region D side. The reflecting film 17 functions as a rear-side end face of the semiconductor laser 100.

In the present example, the lower cladding layer 2 and the upper cladding layer 6 achieve optical confinement of the optical waveguide layer 3, optical waveguide layer 4, light absorbing layer 5, and optical amplification layer 19 above and below them. The optical waveguide layer 4 can be comprised, for example, of a bulk semiconductor layer, e.g., $Ga_{0.22}In_{0.78}As_{0.47}P_{0.53}$. In the present example, the optical waveguide layer 4 has a larger energy gap than the active waveguides 31.

A material to be selected for the light absorbing layer 5 is one with an absorptive characteristic for the lasing wavelengths of the semiconductor laser 100. The material to be selected for the light absorbing layer 5 can be one whose absorption edge wavelength is located, for example, on the longer wavelength side than the lasing wavelengths of the semiconductor laser 100. Preferably, the absorption edge wavelength is located on the longer wavelength side than the longest lasing wavelength of the lasing wavelengths of the semiconductor laser 100.

The light absorbing layer 5 can be constructed, for example, of a quantum well structure and, for example, has a structure in which well layers of $Ga_{0.47}In_{0.53}As$ (5 nm thick) and barrier layers of $Ga_{0.28}In_{0.72}As_{0.61}P_{0.39}$ (10 nm thick) are alternately layered. The light absorbing layer 5 may be a bulk semiconductor and, for example, a material comprised of $Ga_{0.46}In_{0.54}As_{0.98}P_{0.02}$ can be selected for it. The light absorbing layer 5 may be comprised of the same material as the active waveguides 31 and, in that case, the active waveguides 31 and the light absorbing layer 5 can be produced together in the same step, which simplifies production steps.

The optical amplification layer 19 is a region that is given a gain with injection of electric current from the electrode 21, thereby to achieve optical amplification. The optical amplification layer 19 can be comprised, for example, of a quantum well structure, e.g., a structure in which well layers of $Ga_{0.35}In_{0.65}As_{0.99}P_{0.01}$ (5 nm thick) and barrier layers of $Ga_{0.15}In_{0.85}As_{0.32}P_{0.68}$ (10 nm thick) are alternately layered. Another structure to be adopted can be a bulk semiconductor comprised of $Ga_{0.44}In_{0.56}As_{0.95}P_{0.05}$, for example. It is also possible to make the light amplification layer 19 and the active waveguides 31 of the same material. In this case, the light amplification layer 19 and the active waveguides 31 can be produced together in the same step, which simplifies production steps.

The contact layers 13, 20 can be comprised, for example, of p-type $Ga_{0.47}In_{0.53}As$ crystal. The heaters 10 are thin-film resistors comprised of NiCr or the like. Each of the heaters 10 may be formed across two or more segments in the SG-DBR region B. The electrode 21 is comprised of an electroconductive material such as gold. The back electrode 15 is formed across the SG-DFB region A', SG-DBR region B, SOA region C, and light absorbing region D.

The end face film 16 is an AR film having the reflectance of not more than 1.0% and has a property such that the end face is substantially non-reflective. The AR film can be comprised, for example, of a dielectric film of $MgF_2$ and TiON. The reflecting film 17 is an HR film having the reflectance of not less than 10% (e.g., 20%) and can suppress light output leaking from the reflecting film 17 to the outside. For example, it can be comprised of a multilayer film in which layers of $SiO_2$ and TiON are alternately layered in three cycles. The reflectance herein refers to the reflectance for the interior of the semiconductor laser. Since the reflecting film 17 has the reflectance of not less than 10%, it also prevents stray light impinging from the outside onto the rear-side end face, from entering the interior. The stray light entering the semiconductor laser 100 through the rear-side end face is subjected to optical absorption in the light absorbing layer 5. It prevents the stray light from reaching the resonator part of the semiconductor laser 100, i.e., the SG-DFB region A' and the SG-DBR region B.

The diffraction gratings (corrugations) 18 are formed at a plurality of locations with predetermined intervals in the lower cladding layer 2 in the SG-DFB region A' and the SG-DBR region B. They form the sampled gratings in the SG-DFB region A' and in the SG-DBR region B. A plurality of segments are provided in the lower cladding layer 2 in the SG-DFB region A' and in the SG-DBR region B.

The pitch of the diffraction gratings 18 in the SG-DFB region A' may be equal to or different from that of the diffraction gratings 18 in the SG-DBR region B. In the present example, the two pitches are set equal as an example. In the segments, the respective diffraction gratings 18 may have the same length or different lengths. Furthermore, the lengths of the respective diffraction gratings 18 may be set as follows: the diffraction gratings 18 in the SG-DFB region A' have the same length, the diffraction gratings 18 in the SG-DBR region B have the same length, and the length of the diffraction gratings 18 in the SG-DFB region A' is different from the length of the diffraction gratings 18 in the SG-DBR region B.

The SG-DBR region B has a structure in which a plurality of segments having substantially the same optical length are serially coupled. The optical length of the segments in the SG-DBR region B is approximately 180 μm. The SG-DFB region A' has a structure in which a plurality of segments having substantially the same optical length are serially coupled. The optical length of the segments in the SG-DFB region A' is, for example, different from the optical length of the segments in the SG-DBR region B and is approximately 160 μm. The segments in the SG-DBR region B and the segments in the SG-DFB region A' constitute a laser resonator in the semiconductor laser 100.

The operation of the laser device 200 will be described below. The controller 120 refers to the lookup table 130 to acquire an initial current value $I_{LD}$, an initial current value $I_{SOA}$, initial power values $Pa_{Heater}$ to $Pe_{Heater}$, and an initial temperature value $T_{LD}$ corresponding to a set channel. FIG. 12 is an example of the lookup table 130.

The controller 120 supplies an electric current in the amplitude of the initial current value $I_{LD}$ to the electrodes 8. It results in generating light in the active waveguides 31. The light generated in the active waveguides 31 is repeatedly reflected and amplified in the optical waveguide layer 3 and the optical waveguide layer 4 to implement lasing. Reflections from the respective segments interfere with each other. As a result of the interference, a discrete gain spectrum with peak intensities at predetermined wavelength intervals is generated in the SG-DFB region A' and a discrete reflection spectrum with peak intensities at predetermined wavelength intervals is generated in the SG-DBR region B. The combination of the gain spectrum with the reflection spectrum can achieve stable lasing at a desired wavelength by taking advantage of the vernier effect.

The controller 120 controls the temperature control device 110 so that the temperature of the temperature control device 110 becomes the initial temperature value $T_{LD}$. Through this control, the temperature of the semiconductor laser 100 is controlled at a constant temperature around the initial temperature value $T_{LD}$. As a consequence, control is effected on the equivalent refractive index of the optical waveguide in the SG-DFB region A'. The controller 120 supplies powers in the respective amplitudes of the initial power values $Pa_{Heater}$ to $Pc_{Heater}$ to the three heaters 10. By this, the equivalent refractive index of the optical waveguide in the SG-DBR region B is controlled at a predetermined value. The controller 120 supplies a power in the amplitude of the initial power value $Pd_{Heater}$ to the heaters 22 of the segments SG1 and a power in the amplitude of the initial power value $Pe_{Heater}$ to the heaters 22 of the segments SG2. Furthermore, the controller 120 supplies an electric current in the amplitude of the initial current value $I_{SOA}$ to the electrode 21. By the above controls, the semiconductor laser 100 comes to output a laser beam at an initial wavelength corresponding to the set channel.

The SG-DFB region A' is different from the SG-DFB region A in Example 1, in that both of the active waveguides 31 and the passive waveguides 32 are provided across adjacent segments. In conjunction with it, both of the heaters 22 and the electrodes 8 are provided across adjacent segments. The electrode 8 and active waveguide 31 at the end on the SG-DBR region B side are provided up to a middle of the segment at the end on the SG-DBR region B side. The electrode 8 and active waveguide 31 at the end on the SOA region C side are provided up to a middle of the segment at the end on the SOA region C side. In the SG-DFB region A' there are eight segments provided, as an example.

At least one of the plurality of segments constituting the SG-DFB region A' is provided with the phase shift structure. In the present example, the four segments on the SG-DBR region B side are provided with the phase shift structure of $-0.5\pi$ and the four segments on the SOA region C side are not provided with the phase shift structure. The heaters 22 of the segments without the phase shift structure (segments SG1 hereinafter) are connected to a first drive source P1. The heaters 22 of the segments with the phase shift structure (segments SG2 hereinafter) are connected to a second drive source P2 different from the first drive source P1. This configuration allows the segments SG1 and the segments SG2 to be subjected to respective phase controls independent of each other. For giving the phase shift of $0.5\pi$ to the segment closest to the SG-DBR region B, the segment may be given the phase shift amount of $0\pi$ ($=-0.5\pi+0.5\pi$).

In the present example, since the segments SG1 and the segments SG2 are subjected to the respective phase controls independent of each other, it is also feasible to achieve reduction in control power based on Formula (13) above and a possible amount of the reduction is a power reduction of $-8 \times 0.5 \times 0.5 \times P_\pi$ (=25%). It is noted that the SG-DFB region A in Example 1 may be used instead of the SG-DFB region A'. In the present example, the optical waveguide in the SG-DBR region B functions as the second optical waveguide.

Example 3

Figure 13:
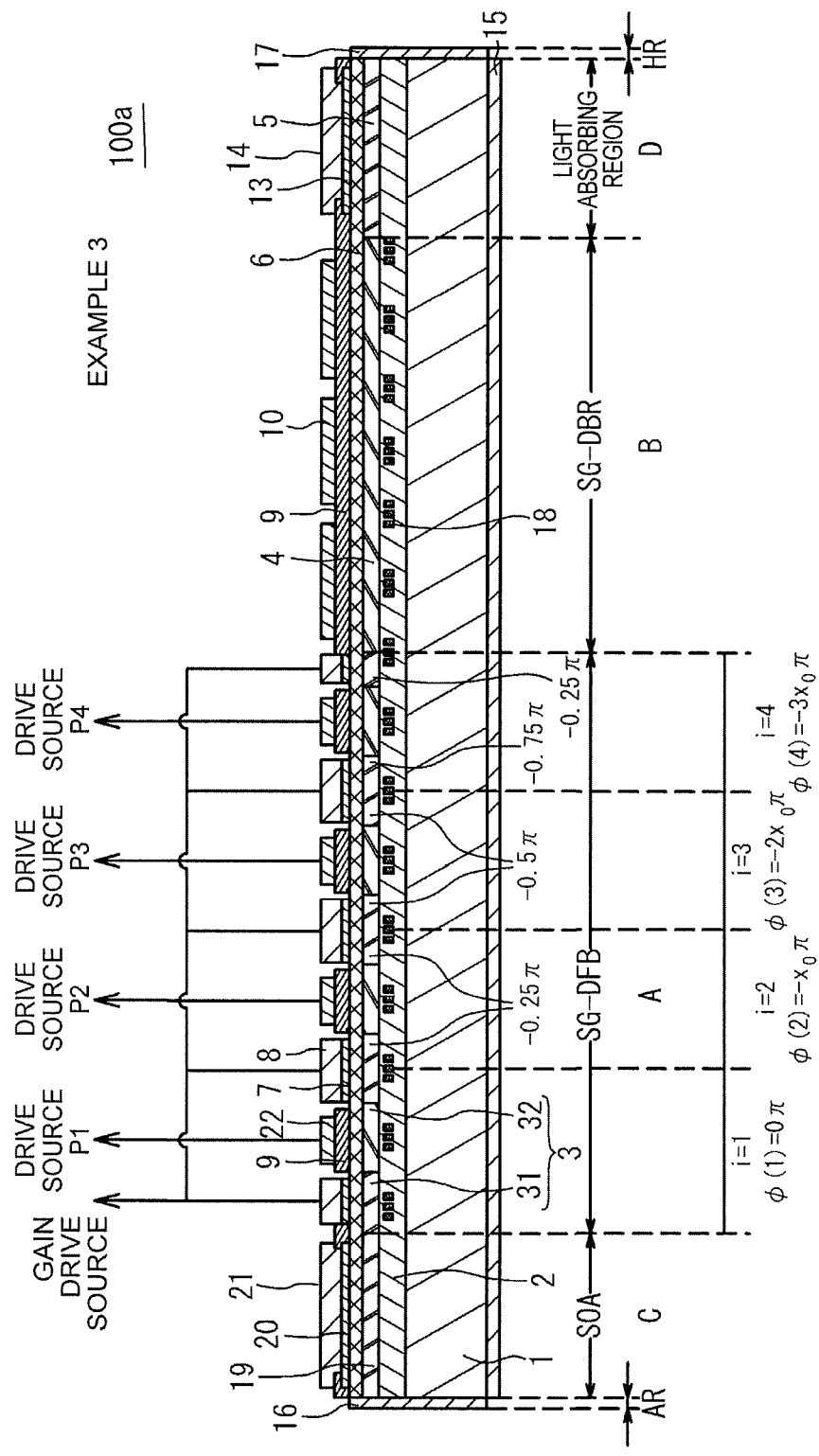
FIG. 13 is a schematic cross-sectional view of a semiconductor laser according to Example 3.

In Example 2 the phase shift amounts of the segments with the phase shift structure were equal, but they may be different. In Example 3, let us consider a case where N segments are equally driven by A independent control sources (N=8 and A=4 as an example). FIG. 13 is a schematic cross-sectional view of a semiconductor laser 100a according to Example 3. As shown in FIG. 13, consideration will be made on an optimum condition for a case where the phase shift structure of a phase shift amount of $\varphi(i)$ below is provided for a target region of the i-th control source.

[Formula 14]

$$\varphi(i) = -(i-1)x_0 \times \pi, \quad i = 1 \sim 4 \quad (14)$$

In this case, it is also necessary to supply the power of Formula (15) below, in order to perform such drive that, with respect to the phase control amount x of the segment with the phase shift 0, the other segments are driven with addition of a power to compensate for the phase shift amount. Factor $n_0$ represents the number of segments driven by one independent control source and, in the case of FIG. 13, $n_0=2$.

[Formula 15]

$$P_{all} = n_0 P_\pi \{x + (x + x_0) + (x + 2x_0) + \\ (x + 3x_0) \ldots (x + (A-1)x_0)\} \quad (15)$$

$$= \sum_{i=1}^{A} n_0 P_\pi (x + i x_0 - x)$$

$$= n_0 P_\pi \left\{ Ax + \frac{A(A-1)}{2} x_0 \right\}$$

The segment first reaching $P_\pi$ for x is the case where the segment with the largest phase shift of $-(A-1) \times \pi x_0$ becomes $x+(A-1)x_0=1$. The total drive power $P_{all}$ at this time is expressed by Formula (16) below.

[Formula 16]

$$P_{all} = n_0 P_\pi \left\{ Ax + \frac{A(A-1)}{2} x_0 \right\} \quad (16)$$

$$= n_0 P_\pi \left\{ A(1-A)x_0 + \frac{A(A-1)}{2} x_0 \right\}$$

$$= n_0 P_\pi A \left\{ 1 - \frac{A-1}{2} x_0 \right\}$$

It can be said by brief consideration that, since the drive consumed power at the next periodic point $x=1-(A-2)x_0$ is the same as the above result, it is a condition to minimize the foregoing consumed power. Namely, the consumed power becomes minimum when $x_0$ is as large as possible. Since $x_0$ is a minimum unit of the built-in phase given and the largest value thereof is represented by Formula (17) below, the maximum consumed power in the case where the periodic reflection structure is driven by use of the A independent control sources is given by Formula (18) below.

[Formula 17]

$$x_0 = \frac{1}{A} \quad (17)$$

[Formula 18]

$$P_{all}(\min) = n_0 P_\pi A \left\{ 1 - \frac{A-1}{2A} \right\} \quad (18)$$

Figure 14:
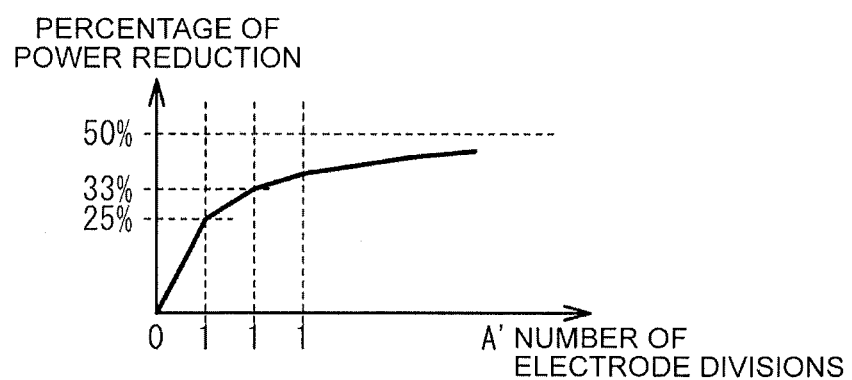
FIG. 14 is a drawing showing a relation between the number of independent power sources and percentage of power reduction.

The relationship between the number of independent power sources and percentage of power reduction is as shown in FIG. 14 and it is understood therefrom that a nearly 50% reduction is possible with increase in the number of electrode divisions. In the present example, the number of electrode divisions is equivalent to the number of heaters 22. In the present example, since the division count A=4 and the number of segments in each divided region, n=2, the built-in phases are expressed by Formula (19) below and the reduction amount is represented by Formula (20) below (reduction amount: 37.5%).

[Formula 19]

$$\phi(1) = 0, \phi(2) = -\pi \frac{1}{4}, \phi(3) = -\pi \frac{2}{4}, \phi(4) = -\pi \frac{3}{4} \quad (19)$$

[Formula 20]

$$NP_\pi - P_{all}(\min) = P_\pi\{1 - 2 \times 4 \times (1 - 3/8)\} = 3P_\pi \quad (20)$$

Example 4

A semiconductor laser 100b according to Example 4 will be described below. FIG. 15 is a schematic cross-sectional view of the semiconductor laser 100b. The semiconductor laser 100b is different from the semiconductor laser 100 according to Example 2, in that another SG-DBR region E is provided instead of the SG-DFB region A' and in that a gain region F and a phase adjusting region G are provided between the SG-DBR region B and the SG-DBR region E.

The gain region F has a structure in which the lower cladding layer 2, a gain layer 25, the upper cladding layer 6, a contact layer 26, and an electrode 27 are layered on the substrate 1. The gain layer 25 has, for example, a structure in which well layers of $Ga_{0.32}In_{0.68}As_{0.92}P_{0.08}$ (5 nm thick) and barrier layers of $Ga_{0.22}In_{0.78}As_{0.47}P_{0.53}$ (10 nm thick) different in composition from each other are layered. The contact layer 26 is comprised, for example, of InGaAsP crystal. The phase adjusting region G has a structure in which the lower cladding layer 2, a waveguide core 28, the upper cladding layer 6, an insulating film 9, and the heater 10 are layered on the substrate 1. The waveguide core 28 is, for example, a bulk, e.g., a waveguide layer comprised of $Ga_{0.28}In_{0.72}As_{0.61}P_{0.39}$.

The SG-DBR region E is comprised of the same material as the SG-DBR region B. However, the optical length of the segments forming the SG-DBR region B is different from that of the segments forming the SG-DBR region E.

In the present example, at least one of the plurality of segments forming the SG-DBR region B is provided with the phase shift structure and the heaters 10 provided corresponding to the segments with the phase shift structure and the heaters 10 provided corresponding to the segments without the phase shift structure are controlled by respective independent power sources. As an example, the three segments on the light absorbing region D side are provided with the phase shift structure of the phase shift amount of $-0.5\pi$, while the four segments on the gain region F side are not provided with the phase shift structure. Furthermore, at least one of the plurality of segments forming the SG-DBR region E is provided with the phase shift structure and the heaters 10 provided corresponding to the segments with the phase shift structure and the heaters 10 provided corresponding to the segments without the phase shift structure are controlled by respective independent power sources. As an example, the three segments on the gain region F side are provided with the phase shift structure of the phase shift amount of −0.5π, while the four segments on the SOA region C side are not provided with the phase shift structure.

In the present example, the power in the phase control operation can be reduced by driving the heaters provided corresponding to the segments with the phase shift structure and the heaters provided corresponding to the segments without the phase shift structure, by the different drive sources. In the present example, one of the optical waveguide in the SG-DBR region B and the optical waveguide in the SG-DBR region E functions as the first optical waveguide and the other as the second optical waveguide.

The plurality of heaters are provided in the SG-DBR region in each of the above examples, but the refractive index of the segments may be controlled by one heater. In each of the above examples, a CSG-DBR (Chirped Sampled Grating Distributed Bragg Reflector) region may be used instead of the SG-DBR region. In the CSG-DBR region, the optical lengths of at least two segments out of a plurality of segments are made different from each other. Because of it, the intensities of peaks in wavelength characteristics of the CSG-DBR region come to have wavelength dependence.

The above detailed the examples of the present invention but it should be noted that the present invention is not limited to such specific examples and can be modified or changed in many ways without departing from the scope of the present invention described in the scope of claims.

What is claimed is:

1. A semiconductor laser that emits light, comprising:
   an optical waveguide including a plurality of segments continuously arranged along a propagation direction of the light emitted from the semiconductor laser, the segments each having a diffraction grating region and a space portion, the diffraction grating region including a diffraction grating, the space portion including no diffraction gratings, the segments having a width common to the segments except for at least one of the segments;
   a first phase control means provided in the at least one of the segments; and
   a second phase control means provided in rest of the segments except for the at least one of the segments, the second phase control means being driven independent of the first phase control means.

2. The semiconductor laser of claim 1,
   wherein, in the at least one of the segments, the space portion has a width different from the width common to the rest of the segments and the diffraction grating region has the width common to the rest of the segments.

3. The semiconductor laser of claim 1,
   wherein the space portion in the at least one of the segments is put between the diffraction grating region of the at least one of the segments and the diffraction grating region of a segment arranged next to the at least one of the segments.

4. The semiconductor laser of claim 1,
   wherein the optical waveguide includes a total N counts of the segments, n counts of the rest of the segments having the width common to the rest of the segments, and m counts of the at least one of the segments having another width different from the width common to the rest of the segments, where m is N−n, and
   wherein the at least one of the segments having the another width each causes a phase shift of −n·π/(n+m) for the light propagating in the optical waveguide with respect to the phase shift caused by the rest of the segments.

5. The semiconductor laser of claim 1,
   wherein the rest of the segments in a part thereof shows an optical gain.

6. The semiconductor laser of claim 1,
   further comprising another optical waveguide that provides a plurality of segments arranged along the propagation direction, the segments in the another optical waveguide each having a diffraction grating region and a space portion, the diffraction grating region in the another optical waveguide having a diffraction grating, the space portion in the another optical waveguide having no diffraction gratings,
   wherein the another optical waveguide is arranged next to the optical waveguide along the propagation direction and optically coupled with the optical waveguide.

7. The semiconductor laser of claim 6,
   wherein the segment in the optical waveguide arranged closest to the another optical waveguide causes an additional phase shift of −0.5π.

8. The semiconductor laser of claim 1,
   wherein the first phase control means and the second phase control means are provided in the space portions in the respective segments.

9. The semiconductor laser of claim 8,
   wherein the first phase control means and the second phase control means are heaters that adjust optical lengths of the segments by varying temperatures thereof.

10. The semiconductor laser of claim 8,
    further including a temperature control device that mounts the semiconductor laser thereon, the temperature control device varying a temperature of the semiconductor laser.

11. The semiconductor laser of claim 1,
    wherein the segments in the optical waveguide constitute a sampled grating diffraction feedback (SG-DFB) structure.

12. The semiconductor laser of claim 11,
    further comprising another optical waveguide that provides a plurality of segments arranged along the propagation direction, the segments in the another optical waveguide each having a diffraction grating region and a space portion, the diffraction grating region in the another optical waveguide having a diffraction grating, the space portion in the another optical waveguide having no diffraction gratings, the another optical waveguide being arranged next to the optical waveguide along the propagation direction and optically coupled with the optical waveguide,
    wherein the segments in the another optical waveguide constitute a chirped sampled grating distributed Bragg reflector (CSG-DBR), and
    wherein the CSG-DBR combined with the SG-DFB tunes a lasing wavelength of the semiconductor laser.

* * * * *